US006873028B2

(12) United States Patent
Belman

(10) Patent No.: US 6,873,028 B2
(45) Date of Patent: Mar. 29, 2005

(54) SURGE CURRENT CHIP RESISTOR

(75) Inventor: Michael Belman, Beer-Sheva (IL)

(73) Assignee: Vishay Intertechnology, Inc., Malvern, PA (US)

(*) Notice: Subject to any disclaimer, the term of this patent is extended or adjusted under 35 U.S.C. 154(b) by 96 days.

(21) Appl. No.: 10/002,868

(22) Filed: Nov. 15, 2001

(65) Prior Publication Data

US 2003/0089964 A1 May 15, 2003

(51) Int. Cl.$^7$ .............................................. H01L 29/00

(52) U.S. Cl. ....................... 257/536; 257/358; 257/359; 257/363; 257/380; 257/489; 257/537; 338/308; 338/320

(58) Field of Search ................................ 257/536–537, 257/546, 489, 358–359, 363, 380; 338/300, 320

(56) References Cited

U.S. PATENT DOCUMENTS

| | | | | |
|---|---|---|---|---|
| 3,998,980 A | * 12/1976 | Antes et al. | 427/103 |
| 4,064,477 A | * 12/1977 | Thompson | 338/51 |
| 4,901,052 A | * 2/1990 | Chapel, Jr. et al. | 338/308 |
| 5,084,694 A | * 1/1992 | Kikuchi et al. | 338/308 |
| 5,321,386 A | * 6/1994 | Ishiguro | 338/269 |
| 5,464,564 A | 11/1995 | Brown | |
| 5,510,594 A | * 4/1996 | Mori et al. | 219/121.69 |
| 5,543,775 A | * 8/1996 | Huck | 338/306 |
| 5,585,776 A | * 12/1996 | Anderson et al. | 338/308 |
| 5,815,065 A | * 9/1998 | Hanamura | 338/309 |
| 5,841,183 A | * 11/1998 | Ariyoshi | 257/536 |
| 5,874,887 A | 2/1999 | Kosinski | |
| 5,907,274 A | 5/1999 | Kimura et al. | |
| 5,929,746 A | * 7/1999 | Edwards, Jr. et al. | 338/320 |
| 5,999,085 A | * 12/1999 | Szwarc et al. | 338/309 |
| 6,404,324 B1 | * 6/2002 | Witt et al. | 338/320 |
| 6,529,115 B2 | * 3/2003 | Szwarc et al. | 338/309 |
| 2001/0026211 A1 | * 10/2001 | Shindoh et al. | 338/308 |

FOREIGN PATENT DOCUMENTS

| | | | |
|---|---|---|---|
| DE | 3035717 | * | 4/1982 |
| EP | 247 685 | * | 5/1987 |
| JP | 04214601 | | 5/1992 |

(Continued)

OTHER PUBLICATIONS

JP 05–090003, Computer translated document.
KOA Flat Chip Surge Current Thick Film SG73 (1 page).
Panasonic Anti–Surge Thick Film Chip Resistor ERJ P08 (3 pages).
Phycomp Surge Chip Resistor SRC01 (7 pages).
BI Technologies thick Film Surge Resistor BSR (4 pages).
TT Electroncs Pulse Withstanding Chip Resistor PWC (6 pages).

*Primary Examiner*—Minhloan Tran
*Assistant Examiner*—Ahmed N. Sefer
(74) *Attorney, Agent, or Firm*—McKee, Voorhees & Sease, P.L.C.

(57) ABSTRACT

A chip resistor comprising a substrate having opposite parallel symmetrical first and second surfaces, a central longitudinal plane of symmetry, separate and spaced first and second resistive layers on the first and second surfaces. The resistive layers are electrically connected in parallel to each other and the first and second surfaces of the substrate are symmetrically located with respect to and equidistant from a central longitudinal plane. Thus, when electrical current passes through the resistive layers, a temperature distribution within the substrate will be substantially symmetrical about the central longitudinal plane of the substrate for eliminating thermal bending thereof. The splitting of the surge current between two resistive layers results in the lower temperature in each resistive layer when compared with the temperature in the single resistive layer of the prior art chip resistor loaded by the same current.

4 Claims, 1 Drawing Sheet

FOREIGN PATENT DOCUMENTS

| | | | | |
|---|---|---|---|---|
| JP | 4-214601 | A | | 5/1992 |
| JP | 04239101 | | | 8/1992 |
| JP | 5-90003 | | * | 4/1993 |
| JP | 05090003 | | | 4/1993 |
| JP | 5-121201 | | * | 5/1993 |
| JP | 05-90003 | | | 9/1993 |
| JP | 6-5401 | | * | 1/1994 |
| JP | 06089801 | | | 3/1994 |
| JP | 9-63805 | | * | 3/1997 |
| JP | 11-251105 | | * | 9/1999 |
| JP | 11254249 | | | 12/1999 |
| JP | 2000200601 | | | 7/2000 |

* cited by examiner

SURGE CURRENT CHIP RESISTOR

BACKGROUND OF THE INVENTION

The present invention relates to chip resistors. More particularly, the present invention relates to chip resistors designed to tolerate high surge current.

In a number of applications, chip resistors are required to dissipate pulsed electrical power. Such applications include protective circuitry for communication lines, motor drives, and power supplies. In these and other applications, voltages are applied to the terminals of the resistor for short time periods. Sometimes this is referred to as pulse loading. This amount of time of each pulse is commonly less than one second.

The general problem with using chip resistors in applications and environments which involve pulse loading relates to the magnitude of the instantaneous pulsed power. The instantaneous pulsed power may be many times higher than the steady state power rating of the resistor. When the instantaneous power is great enough or applied for a long enough time period, the result is resistor failure. Thus the problem is to maximize the pulsed power that may be safely dissipated by the resistor.

Various prior attempts at solving this problem have been made. One such attempt applicable to thick film resistor chips involves laser trimming. One example of laser trimming a thick film resistor chip is found in U.S. Pat. No. 5,874,887 to Kosinski. In the laser trimming of Kosinski, special methods are used to smooth the electrical current distribution in the resistive film through specially oriented or positioned cuts. Another prior art attempt has involved giving up on the use of laser cutting. One example of such a device is the SG73 Flat Chip Surge Current Thick Film resistor available from KOA.

Another approach has involved using special types of resistor pastes. Special resistor pastes are used to form restive film that is more tolerant to pulse loading as compared to the resistive film originating from a regular resistive paste. One example of the use of resistor pastes is disclosed in U.S. Pat. No. 5,464,564 to Brown.

Despite these attempts, problems remain. Therefore, it is a primary object of the invention to improve upon the state of the art.

It is a further object of the present invention to provide a chip resistor that has improved tolerance for instantaneous pulsed power.

Another object of the present invention is to provide a chip resistor that has improved tolerance for instantaneous pulsed power without increasing the size of the chip.

Yet another object of the present invention is to provide a chip resistor that is not susceptible to solder joint fatigue caused by multiple pulse applications.

A further object of the present invention is to provide a chip resistor that is not limited to a particular manufacturing process and can be a thick-film resistor, thin-film resistor, or a foil resistor.

A still further object of the present invention is to provide a chip resistor that can be efficiently manufactured without substantially increasing manufacturing costs.

BRIEF SUMMARY OF THE INVENTION

The invention relates to a chip resistor capable of dissipating short duration, high level electrical power. The chip resistor of the present invention is applicable to all types of chip resistors having resistive layers attached to the much thicker substrate, including thick-film resistors, thin-film resistors, and foil resistors.

The chip resistor of the present invention includes a substrate having opposite parallel first and second surface. The first surface 24 and the second surface 26 are also symmetrical.

The chip resistor of the present invention further includes a first resistive layer and a second resistive layer. The first resistive layer and the second resistive layer are located symmetrically on both sides of the substrate. When electrical current passes through the resistive layers, a temperature distribution within the substrate will be substantially symmetrical about a central longitudinal plane of symmetry of the substrate for eliminating thermal bending. The central longitudinal plane of symmetry is defined by a cross section along a central longitudinal axis of symmetry. Resistor terminals electrically connect the first resistive layer and the second resistive layer in parallel.

The chip resistor of the present invention has been shown to provide a number of advantages over prior art chip resistors. In particular, the chip resistor of the present invention tolerates higher instantaneous pulsed power when compared to a same size prior art chip resistor. In addition, the chip resistor of the present invention is not susceptible to solder joint fatigue caused by the application of multiple pulses thus providing a substantial advantage over prior art due to a temperature distribution that is symmetrical about a middle plane and which eliminates thermal bending. Further, an additional manufacturing benefit of the present invention is that it may be directly loaded to a pick-and-place machine from a bulk case without concern for top-bottom orientation.

DETAILED DESCRIPTION OF THE INVENTION

Figure 1:
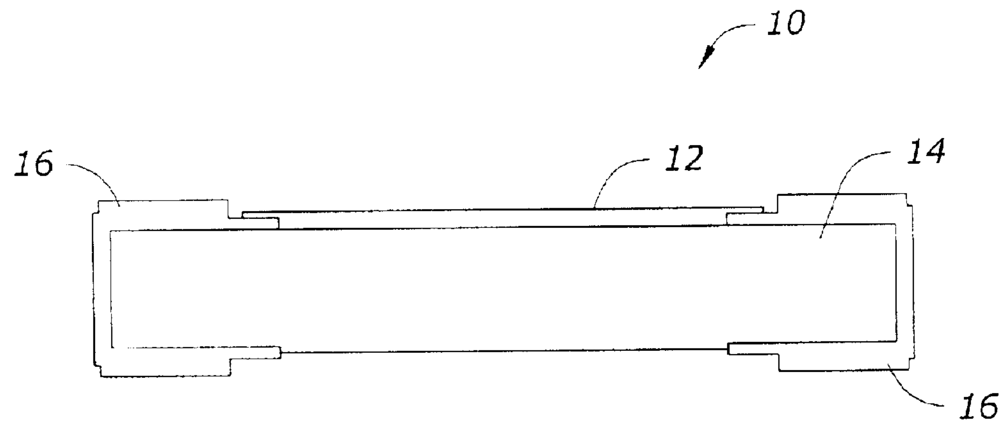
Fig. 1 (Prior Art)
FIG. 1 is a front view of a prior art chip resistor.

FIG. 1 shows a side view of a prior art chip resistor 10. The prior art as shown in FIG. 1 is characterized by a single resistive layer 12 which may be covered by a protective coating. The single resistive layer 12 is located on one side of a ceramic substrate 14. The chip resistor 10 also includes resistor terminals 16.

Figure 2:
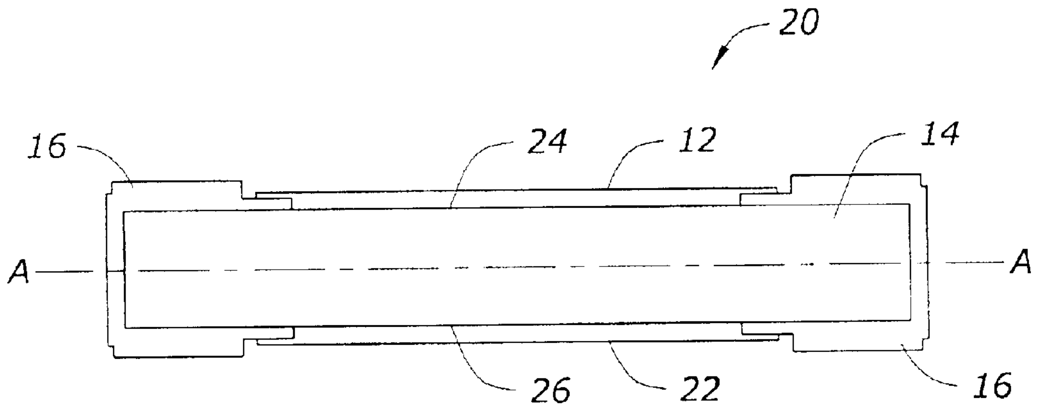
FIG. 2 is a front view of a chip resistor according to the present invention.

One embodiment of the present invention is shown in FIG. 2. The chip resistor 20 of the present invention includes a first resistive layer 12 and a second resistive layer 22. Each of the resistive layers (12 and 22) may be covered by protective coatings (not shown). The first resistive layer 12 and the second resistive layer 22 are located symmetrically on both sides of the substrate 14 which may be a ceramic substrate. The resistor terminals 16 electrically connect the first resistive layer 12 and the second resistive layer 22 in parallel. The resistor terminals 16 are suitable for solder or adhesive or wire bond mounting to a circuit board.

A central longitudinal plane A—A (plane of symmetry) is shown transversing the chip resistor 20. The central longitudinal plane of symmetry is defined as the plane defined by a cross section along a central longitudinal axis of symmetry. The longitudinal plane A—A is substantially parallel to a first surface 24 of the substrate 14 and a second surface 26 of the substrate 14. The central longitudinal plane A—A is substantially equidistant between the first surface 24 and the second surface 26. The substrate has a rectangular cross-section (not shown). Preferably, the first resistive layer 12 and the second resistive layer 22 are symmetric about the central longitudinal plane.

The chip resistor 20 of FIG. 2 has been shown to provide a number of advantages over prior art chip resistors. In particular, chip resistor 20 tolerates higher instantaneous pulsed power when compared to a same size prior art chip resistor. In particular, this increased tolerance can be up to two times as high depending upon the pulse duration.

The chip resistor of the present invention also is not susceptible to solder joint fatigue caused by the application of multiple pulses thus providing a substantial advantage over prior art. In particular, the chip resistor 20 has a temperature distribution substantially symmetrical about the central longitudinal plane for eliminating thermal bending.

Further, an additional manufacturing benefit of the present invention is that it may be directly loaded to a pick-and-place machine from a bulk case without concern for top-bottom orientation.

Dissipation of the pulsed power in the chip resistor may be regarded as short-time heat generation in the resistive layer attached to the substrate surface and simultaneous heat transfer into the substrate. It is noted that heat transfer outside the resistor during short-time pulse application is generally considered negligible. The overload of the resistor by single or multiple pulses may result in resistor failure. Types of resistor failure includes resistive layer burn-off and solder joint fatigue.

If the voltage applied to the resistor does not exceed the maximum permissible voltage the resistor failure commonly stems from overheating of the resistive layer. It may be shown analytically that the maximum temperature rise in the resistive layer is proportional to the applied electrical power and inversely proportional to the resistive layer area:

$$T(t) = \frac{2W}{S} \cdot \sqrt{\frac{t}{\pi k c \rho}} \qquad (1)$$

where:

t—time, sec;

T(t)—temperature rise in the resistive film, K;

W—square-wave pulse power, W;

S—resistive layer area, $m^2$;

$\pi$=3.14;

k—thermal conductivity of the substrate material, W/(m.K);

c—heat capacity of the substrate material, J/(kg.K);

$\rho$—density of the substrate material, $kg/m^3$.

The additional resistive layer 22 in the resistor 20 doubles the total resistive layer area as compared to that of FIG. 1. Therefore double power applied to the proposed resistor will result in the same temperature rise in its resistive layer as in the case of one-fold power application to the prior art chip resistor of the same substrate size.

This effect may be explained in the different way. The electrical current that passes through the resistor 20 divides, and half of it passes through the upper resistive layer 12 while the second half passes through the lower resistive layer 22. The density of the current, power, and temperature rise in each resistive layer will be half of that in the prior art chip resistor of the same substrate size loaded by the same pulse load (i.e. FIG. 1). Therefore, the maximal pulsed power dissipated by the chip resistor according to the present invention is as large as approximately twice that of a prior art chip resistor of the same substrate size.

The described effect takes place only in the case of the short-time loading when pulse duration does not exceed the characteristic time needed for heat propagation through the substrate that separates two resistive layers in the proposed chip resistor. The mentioned characteristic time depends on the thickness and physical properties of the substrate:

$$\tau = \frac{c \rho h^2}{4k} \qquad (2)$$

Where t is characteristic time expressed in seconds, h is the substrate thickness expressed in meters, the other parameters are the same as in equation (1). For example, for 0.5 mm alumina substrate $\tau \approx 10$ milliseconds. That means that the doubled power capacity will be relevant to 0–10 milliseconds range of pulse duration. The further extension of pulse duration gradually reduces the pulsed power capacity of the proposed resistor to the pulsed power capacity of prior art resistor.

Another type of resistor failure involves solder joint fatigue. It may be shown that prior art chip resistor loaded by pulse is characterized by monotone decreasing temperature distribution in direction from resistive layer to the opposite free surface of the substrate. This temperature distribution results in monotone decreasing of thermal expansion of the substrate in the same direction. It becomes apparent in the substrate bending. The bending creates mechanical stress in the solder joints between the chip and printed circuit board. Multiple application of the pulses may result in solder joint fatigue (cracking).

The chip resistor of the present invention has symmetrical construction as shown in FIG. 2. Its temperature distribution is non-uniform but symmetrical with respect to the central longitudinal plane A—A. The symmetry completely eliminates thermal bending of the chip and the damage of the solder joints resulting from the multiple pulse loading.

The chip resistor of the present invention is not limited to a particular type of resistor, but rather applies to any number of types of resistors including thick-film resistors, thin-film resistors, and foil resistors.

What is claimed is:

1. A chip resistor being symmetrical to allow for direct loading to a pick-and-place machine without concern for top-bottom orientation, comprising:

a substantially flat substrate having opposite parallel symmetrical top and bottom surfaces, and a central longitudinal plane of symmetry;

separate and spaced first and second resistive layers on the top add bottom surfaces, respectively, electrically connected in parallel to each other; and the top and bottom surfaces of the substrate being symmetrically located with respect to and equidistant from the central longitudinal plane so that when electrical current passes through the resistive layers, a temperature distribution within the substrate will be substantially symmetrical about the central longitudinal plane of the substrate for eliminating thermal bending thereof;

wherein an area of the first resistive layer is substantially equal to an area of the second resistive layer such that the chip resistor with both resistive layers tolerates higher instantaneous pulsed power than either layer could provide separately and individually;

first and second terminals for surface mounting, each terminal being electrically connected to the first and second resistive layers, the terminals being substantially symmetrical about the central longitudinal plane; and the substrate, resistive layers, and terminals are symmetrical about the central longitudinal plane to allow for direct loading to the pick-and-place machine without concern for top-bottom orientation.

2. The chip resistor of claim 1 wherein the first resistive layer and the second resistive layer are thick film resistive layers.

3. The chip resistor of claim 1 wherein the first resistive layer and the second resistive layer are thin film resistive layers.

4. The chip resistor of claim 1 wherein the first resistive layer and the second resistive layer are foil resistive layers.

* * * * *

UNITED STATES PATENT AND TRADEMARK OFFICE

CERTIFICATE OF CORRECTION

PATENT NO. : 6,873,028 B2 
DATED : March 29, 2005
INVENTOR(S) : Belman, Michael

It is certified that error appears in the above-identified patent and that said Letters Patent is hereby corrected as shown below:

Column 4,
Line 53, should read -- top and bottom surfaces, respectively, electrically con- --

Signed and Sealed this

Seventh Day of June, 2005

JON W. DUDAS
*Director of the United States Patent and Trademark Office*